United States Patent [19]

Matsumoto et al.

[11] Patent Number: 4,797,001

[45] Date of Patent: Jan. 10, 1989

[54] SUBSTRATE BIAS GENERATOR FOR USE IN DYNAMIC RANDOM ACCESS MEMORY

[75] Inventors: Noriaki Matsumoto; Koichiro Mashiko; Kazutami Arimoto; Kiyohiro Furutani; Yoshio Matsuda, all of Hyogo, Japan

[73] Assignee: Mitsubishi Denki Kabushiki Kaisha, Tokyo, Japan

[21] Appl. No.: 79,147

[22] Filed: Jul. 29, 1987

[30] Foreign Application Priority Data

Jul. 30, 1986 [JP] Japan ............... 61-179740

[51] Int. Cl.$^4$ ............ G11C 7/00; G11C 7/02; H01L 27/02; H03K 3/353
[52] U.S. Cl. ...................... 365/189; 365/53; 357/236; 357/41; 307/304
[58] Field of Search ............. 365/189, 226, 227, 53; 357/41; 307/296 A, 304

[56] References Cited

U.S. PATENT DOCUMENTS

| | | | |
|---|---|---|---|
| 4,233,672 | 11/1980 | Suzuki et al. | 365/226 |
| 4,455,628 | 6/1984 | Ozaki et al. | 365/226 |
| 4,559,694 | 12/1985 | Yoh et al. | 357/41 |
| 4,691,304 | 9/1987 | Hori et al. | 365/226 |
| 4,695,746 | 9/1987 | Tobita | 307/304 |

FOREIGN PATENT DOCUMENTS 59-14665  1/1984  Japan .
60-38028  8/1985  Japan .

OTHER PUBLICATIONS

Substrate Bias Voltage Generator on Dynamic MOS RAM Chip, Shimotori et al., LSI Research and Development Laboratory, Mitsubishi Electric Corp., Itami-shi, Japan, pp. 769-776.

Alpha-Particle-Induced Field and Enhanced Collection of Carriers, IEEE Electron Device Letters, vol. EDL-3, No. 2, Feb. 1982, pp. 31-34.

Primary Examiner—Terrell W. Fears
Assistant Examiner—Melissa J. Koval
Attorney, Agent, or Firm—Lowe, Price, LeBlanc, Becker & Shur

[57] ABSTRACT

The invention relates to a substrate bias generator for use in dynamic random access memory, and in which either a plurality of transistors for rectification are disposed between a coupling capacitor and a substrate potential electrode or a threshold voltage of a transistor for rectification between the coupling capacitor and the substrate potential electrode is different from a threshold voltage of the other transistor making the absolute value of substrate potential smaller thereby, so that a depletion-layer distance formed between a P-type substrate and N$^+$-type substrate is shortened and that effect due to incidence of α-particle is reduced resulting in reducing soft error rate.

2 Claims, 3 Drawing Sheets (a)

(b)

(c)

(d)

SUBSTRATE BIAS GENERATOR FOR USE IN DYNAMIC RANDOM ACCESS MEMORY

FIELD OF THE INVENTION

The present invention relates to a substrate bias generator for use in dynamic random acess memory (hereinafter referred to as DRAM) including insulated gate type field effect transistors (hereinafter referred to as MOSFET) as the fundamental elements.

DESCRIPTION OF THE PRIOR ART

Generally in the DRAM it is necessary to give a certain negative potential, and for that purpose a substrate bias generator is provided therein. For example, FIG. 1 shows a conventional bias generator for use in DRAM which is disclosed in the article No. 56-640 (C-126), the November issue of the transactions of the Institute of Electronics and Communication Engineers of Japan. In the Drawing, a reference numeral 1 denotes a ring generator (substrate potential generating means) comprising a plurality of inverters 1a, 1b, ..., 1i disposed for producing the substrate potential. Numeral 2 denotes a junction of a circuit for output of the generator 1, numeral 3 denotes a coupling capacitor, 4 denotes a junction of the circuit on the opposite side of the junction 2 with the coupling capacitor 3 therebetween, 6 denotes a MOSFET for rectifiction provided between the coupling capacitor 3 and the substrate potential electrode, 7 denotes a MOSFET for rectification provided likewise between the coupling capacitor and the ground potential. Numeral 8 denotes a P-N parasitic diode formed unavoidably on the junction 4, numeral 9 denotes a floating capacitance associated with the region between the junction 4 and the ground potential, 10 denotes a parasitic capacitance associated with the region between the substrate and the ground potential, and Vbb denotes a substrate potential.

The aforementioned conventional substrate bias generator for use in DRAM operates in the following manner. An output signal of the ring generator 1 arranged on the integrated circuit is applied to the junction 2. FIG. 2 (a) shows the output signal of the generator 1. The output amplitude voltage of the generator 1 is used as the power source voltage Vcc supplied to the IC, which is similar in the other examples described later. When the signal shown in FIG. 2 (a) is applied to the junction 2, the potential of the junction 4 has a amplitude Vp as shown in the following expression:

$$Vp = (C3/C3+C9) \cdot Vcc \ldots \quad (1)$$

where: C3, C9 indicate respectively capacitance values of the coupling capacitor 3 and the parasitic capacitance 9. However, since there is a relation of C3 C9 in general, the above expression (1) can be expressed in the following approximation:

$$Vp = Vcc \ldots \quad (2)$$

Then considering that the source side of the MOSFET 7 is placed at the ground potential, the MOSFET 7 is in a conducted state when the potential of the junction 4 comes up to a level of the threshold voltage Vt7 or so.

Accordingly, the potential of the junction 4 has the values of Vt7 and $-(Vp-Vt7) \approx -(Vcc-Vt7)$. Considering a state near the normal state, the MOSFET 6 and the parasitic diode 8 are in a non-conducted state when the potential of the junction 4 is near Vt7. On the other hand, the MOSFET 6 and the parasitic diode 8 are in a conducted state when the potential of the junction 4 is $-(Vcc-Vt7)$, and the electric charge flows from the parasitic capacitance 10 to the junction 2 by way of MOSFET 6, parasitic diode 8 and coupling capacitor 3, thereby the electric charge of the parasitic capacitance 10 being discharged. Establishing that the threshold voltage of the MOSFET 6 as Vt6 and the forward dropping voltage of the parasitic diode 8 as Vd, the substrate potential is $-(Vcc-Vt7-Vt6)$ as shown in FIG. 2 (c).

According to the conventional substrate potential generator of the above composition, a specified negative potential is given in the above described manner.

However, there exist several problems in the prior art. That is, the substrate potential is large, therefore the depletion-layer distance formed between the P-substrate and N+-layer is large, and as a result the storage capacitance Cs of the memory cell decreases. Moreover, since the depletion-layer distance is large, the conventional generator is considerably influenced by funneling effect (see IEEE EDL, vol EDL-3, No. 2, p 31 (1982)), and collection efficiency of minor carriers is large. As a result, soft error is easy to occur due to α-particle, and malfunction rate increases.

SUMMARY OF THE INVENTION

Accordingly, it is an object of the present invention to provide an improved substrate bias generator in which the depletion-layer distance formed between the P-type substrate and the N+-layer is shortened, the funneling effect due to incidence of α-particle is reduced, and soft error rate is improved, either by disposing a plurality of transistors for rectification between the coupling capacitor and the substrate potential electrode or by differentiating a threshold voltage of the transistor for rectification disposed between the coupling capacitor and the substrate bias electrode from a threshold voltage of the other transistors, thereby making the absolute value of substrate potential smaller.

DETAILED DESCRIPTION OF THE PREFERRED EMBODIMENT

An embodiment of the present invention is now described hereunder referring to the accompanying drawings.

Figure 3:
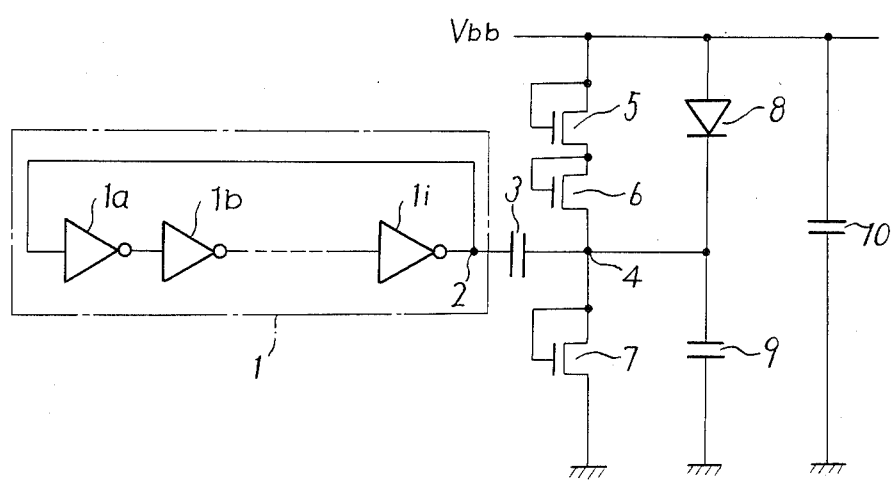
FIG. 3 is a circuit diagram of a substrate bias generator for use in DRAM according to one embodiment of the present invention.

In FIG. 3, a reference numeral 5 denotes a MOSFET provided between the substrate potential electrode and the MOSFET 6 for rectification. The remaining parts are similar to the aforesaid prior art, and the same reference numeral denotes like parts. In the generator of this embodiment, two MOSFETs for rectification are provided between the coupling capacitor 3 and the substrate potential electrode.

Described hereunder is function and effect of the embodiment.

Figure 1:
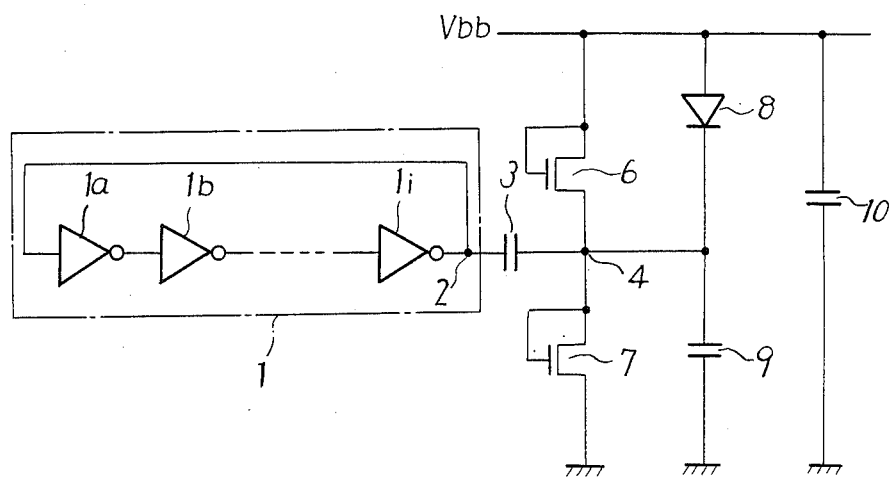
FIG. 1 is a circuit diagram of a substrate bias generator according to the prior art.
Figure 2:
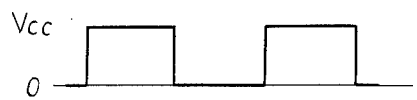
FIG. 2 (a–d) is an operation timing chart thereof.
Figure 2:
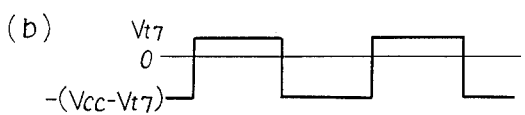
Figure 2:
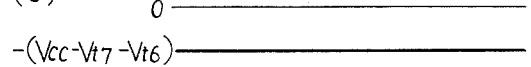
Figure 2:
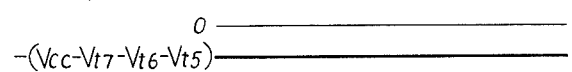

The method for generating the substrate potential is basically the same as the prior art, but since the MOS- FET 5 is added, the substrate potential Vbb is −(Vcc−Vt7−Vt6−Vt5) as shown in FIG. 2 (b), which is a distance from the prior art. In this manner, the absolute value of substrate potential Vbb is smaller by Vt5 as compared with the prior art.

Further, only one MOSFET 5 is used in the foregoing embodiment, but it is also preferable that not less than two MOSFETs are used when necessary.

Furthermore, the same effect as the foregoing embodiment having the MOSFET 5 can be obtained by changing only the threshold voltage of the MOSFET 6 without changing the threshold voltage of the other MOSFET.

Moreover, it is also preferable that both generators of the above embodiment and the prior art are disposed and only the generator of the prior art is used when it is desirable that the absolute value of substrate potential is large as is the time of closing the power source, while only the generator of the above embodiment is used at the time of normal operation, such separate proper use being achieved by change-over control.

In addition, although the substrate is of P-type in the foregoing embodiment, the present invention is also applicable to the N-type substrate, performing the same effect as the foregoing embodiment.

As has been described so far, in the substrate bias generator for use in DRAM according to the present invention, since either the plural transistors for rectification are disposed between the coupling capacitor and the substrate potential electrode or the threshold of the transistors for rectification disposed between the coupling capacitor and the substrate potential electrode is different from the threshold of the other transistors so as to make the absolute value of substrate potential smaller, a peculiar effect is achieved such that the soft error rate due to α-particle is improved.

What is claimed is:

1. A substrate bias generator for setting a potential of a semiconductor substrate in a dynamic random access memory and reducing soft errors such as errors caused by alpha ray irradiation, in an IC having insulated gate type field effect transistors (IGFET) as the fundamental elements, said substrate bias generator comprising:
   substrate potential generating means provided for generating a substrate potential,
   a coupling capacitor connected to an output of said substrate potential generating means,
   an IGFET transistor for rectification provided between said coupling capacitor and a ground potential,
   substrate potential control means provided between said coupling capacitor and a substrate potential electrode for controlling the substrate potential to maintain a required level, said substrate potential control means comprising a plurality of IGFET transistors connected in series between said coupling capacitor and said substrate potential electrode.

2. A substrate bias generator for setting a potential of a semiconductor substrate in a dynamic random access memory and reducing soft errors such as errors caused by alpha ray irradiation, in an IC having insulated gate type field effect transistors (IGFET) as the fundamental elements, said substrate bias generator comprising:
   substrate potential generating means provided for generating a substrate potential,
   a coupling capacitor connected to an output of said substrate potential generating means,
   a first IGFET transistor for rectification provided between said coupling capacitor and a ground potential,
   substrate potential control means provided between said coupling capacitor and a substrate potential electrode for controlling the substrate potential to maintain a required level, said substrate potential control means comprising a second IGFET transistor for rectification connected between said coupling capacitor and said substrate potential electrode said second transistor having a threshold voltage thereof different from a threshold voltage of said first transistor for rectification.

* * * * *